United States Patent [19]

Strenglein

[11] 3,890,573

[45] June 17, 1975

[54] HIGH CONVERSION EFFICIENCY HARMONIC MIXER

[75] Inventor: Harry F. Strenglein, Clearwater, Fla.

[73] Assignee: Sperry Rand Corporation, New York, N.Y.

[22] Filed: June 10, 1974

[21] Appl. No.: 477,943

[52] U.S. Cl. .................. 325/451; 321/60; 325/435; 325/445; 325/449; 328/15; 329/153

[51] Int. Cl. .............................................. H04b 1/26

[58] Field of Search .................... 325/430, 435–437, 325/442, 443, 445–447, 449–451; 321/60, 65; 307/271; 328/15, 158; 329/154, 163, 164, 153; 332/44; 333/7 D

[56] References Cited

UNITED STATES PATENTS

| | | | |
|---|---|---|---|
| 2,706,775 | 4/1955 | Carlson | 325/449 |
| 3,227,955 | 1/1966 | Yasuda et al. | 325/449 |
| 3,643,163 | 2/1972 | Bruck | 325/177 |
| 3,651,410 | 3/1972 | Davies | 325/446 |

*Primary Examiner*—Robert L. Griffin
*Assistant Examiner*—Marc E. Bookbinder
*Attorney, Agent, or Firm*—Howard P. Terry

[57] ABSTRACT

A high conversion efficiency harmonic signal mixer is provided by employing in a mixer circuit a non-rectifying semiconductor device having a generally symmetric response in the first and third quadrants of its voltage-current characteristic curve and a substantially central substantially non-conducting response adjacent the zero voltage and zero current origin of the characteristic curve.

6 Claims, 33 Drawing Figures

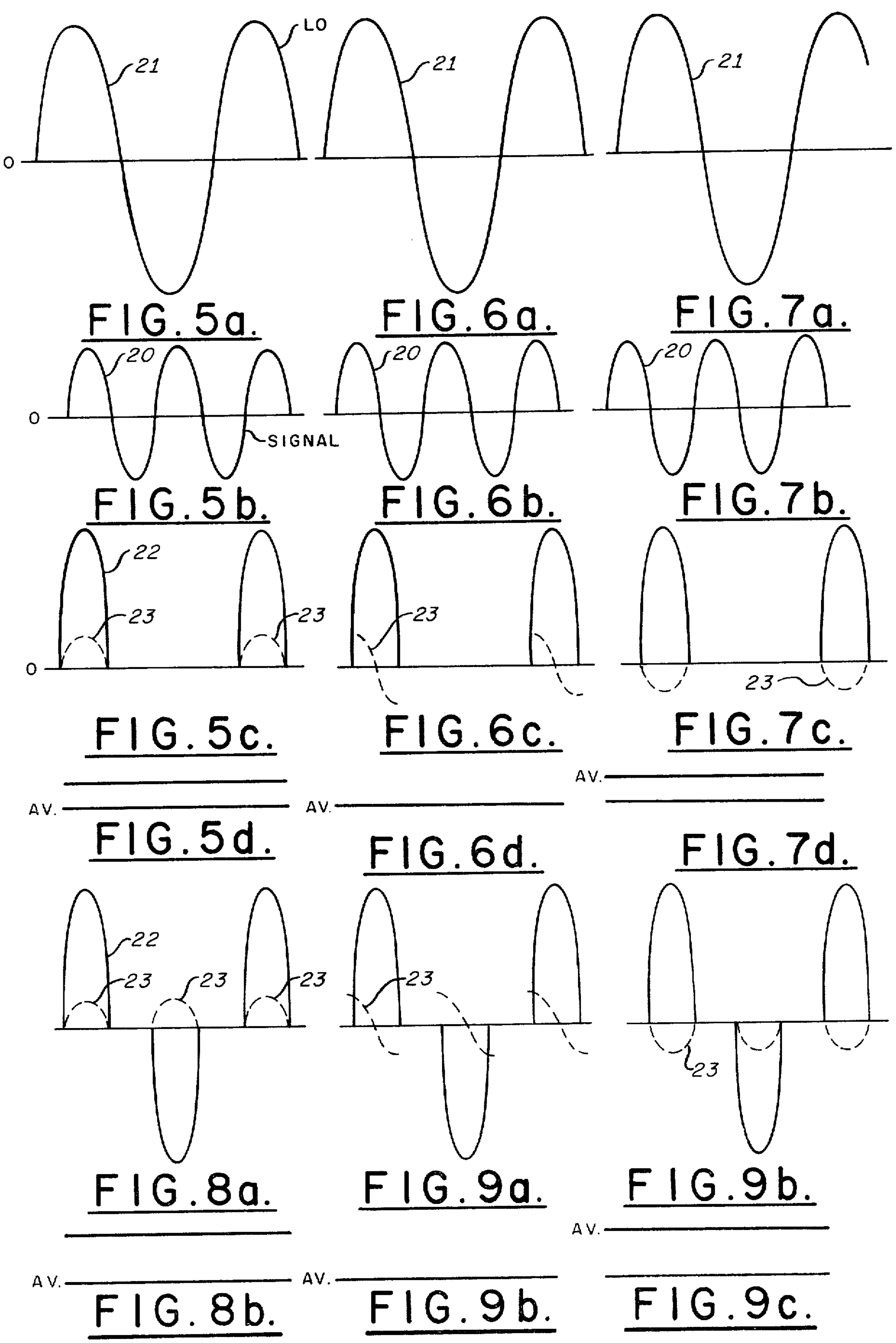
FIG. 5a. FIG. 6a. FIG. 7a. FIG. 5b. FIG. 6b. FIG. 7b. FIG. 5c. FIG. 6c. FIG. 7c. FIG. 5d. FIG. 6d. FIG. 7d. FIG. 8a. FIG. 9a. FIG. 9b. FIG. 8b. FIG. 9b. FIG. 9c.

HIGH CONVERSION EFFICIENCY HARMONIC MIXER

BACKGROUND OF THE INVENTION

1. Field of the Invention

The invention pertains to radio signal mixing apparatus and more especially concerns high conversion efficiency harmonic frequency signal mixers utilizing non-rectifying semiconductor elements.

2. Description of the Prior Art

Prior art electrical signal frequency mixers have employed several different approaches with various degrees of success; the particular characteristics of some of these mixer concepts remain to be discussed in additional detail within the body of this specification.

At an early stage in the development of microwave receivers, it was found difficult to construct vacuum tube local oscillators with sufficient power output at the desired increasingly high microwave communication frequencies so that, instead, the harmonic power output of a crystal diode in a low frequency oscillator circuit was used as a substrate. On the other hand, one crystal diode might be used to generate the harmonic power and another for the mixing function, or one crystal diode was arranged to perform both the generation and the mixing functions. The harmonic mixer has been examined by Torrey and Whitmer in Crystal Rectifiers, which is Volume 15 of the Radiation Laboratory Series, 1948, McGraw-Hill (see pages 167 through 174) and by others.

Currently, harmonic frequency mixers are used in many microwave receivers to take advantage of their simplicity, low weight, and low cost. The disadvantage that such mixers provide a conversion loss worse than that of a fundamental frequency mixer by a factor approximately equal to the harmonic number has simply been tolerated because of the weight-cost advantage.

The fundamental frequency products of the mixing process are normally larger in amplitude than the desired harmonic mixer product. These unwanted products can be reflected back to the diode and can again mix with the local oscillator signal to regenerate the signal voltages at a phase determined by the phase of the reflection. The phase can not be controlled in broad band devices. Consequently, both conversion loss and flatness can be considerably worse than first order theory would indicate. Finally, because the conduction angle of the diode must be controlled to achieve any harmonic mixing capability, high ratios of local oscillator to signal power can not be freely used to reduce spurious responses.

SUMMARY OF THE INVENTION

The present invention is an improvement in harmonic signal mixers achieving greatly increased conversion efficiency. For this purpose, the novel mixer employs a dual terminal non-rectifying semiconductor device having a generally symmetric response in the first and third quadrants of its voltage-current characteristic curve along with substantially no response in a substantially non-conducting substantially central region adjacent the zero voltage and zero current origin of the characteristic curve.

BRIEF DESCRIPTION OF THE DRAWINGS

FIGS. 2A through 9C are graphs of wave forms useful in explaining the operation of the invention.

DESCRIPTION OF THE PREFERRED EMBODIMENTS

Figure 1:
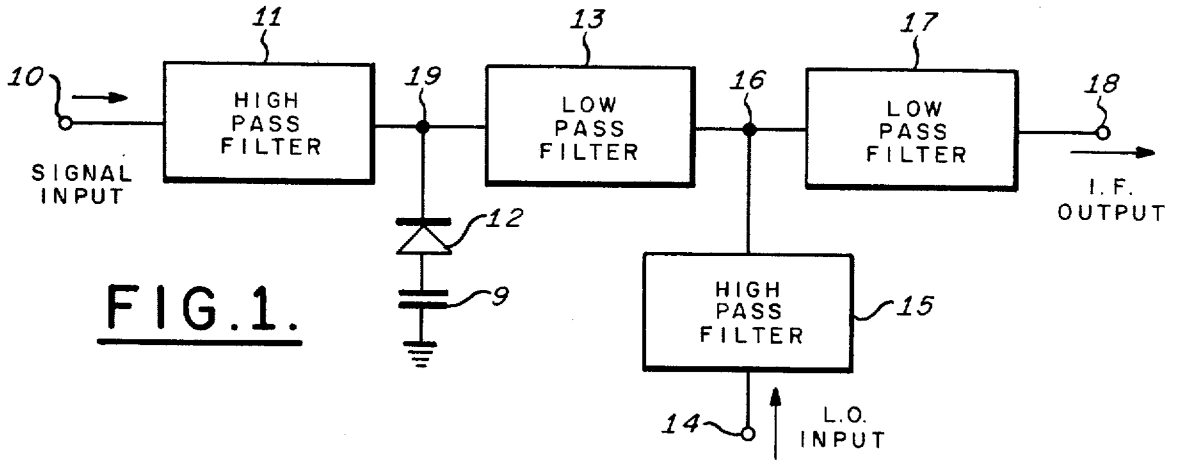
FIG. 1 is a block diagram generally illustrating one form of the invention.

In FIG. 1, there is represented the equivalent circuit of a mixer which may first be considered to be a normal harmonic mixer or a normal fundamental signal mixer in the absence of capacitor 9. The input port 10 passes the signal frequency energy through high pass filter 11 to junction 19 which is coupled to ground through diode 12. Filter 11 has a cut off frequency lower than the signal frequency. Junction 19 is coupled through low pass filter 13 to a second junction 16, which latter is supplied with local oscillator energy via terminal 14 and high pass filter 15. Low pass filter 13 has a cut off frequency less than the signal frequency. On the other hand, filter 15 has a cut off frequency lower than the local oscillator frequency. Junction 16 supplies the mixer output through a low pass filter 17, also having a cut off frequency lower than the local oscillator frequency, to the intermediate frequency output port 18.

Figure 2A:
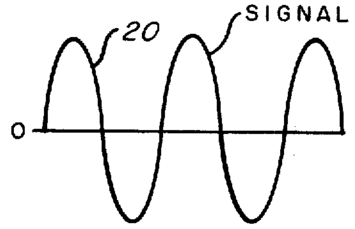

FIGS. 2A through 4D are graphs of wave forms illustrating the operation of a normal fundamental mixer circuit for three representative situations. FIGS. 2A, 3A, 4A show the signal wave form 20 as having constant reference phase characteristics in three successive time intervals, while FIGS. 2B, 3B, 4B show the local oscillator waves for the same successive time intervals. At the instant of time shown in FIGS. 2A and 2B, the local oscillator wave 21 is substantially in phase with the signal wave 20, so that the rectified current developed by diode 12 in the absence of capacitor 9 of FIG. 1 is made up of the added local oscillator component 22 and signal component 23 (FIG. 2C) and then the diode rectified current 24 (FIG. 2D) is a maximum.

Figure 3A:
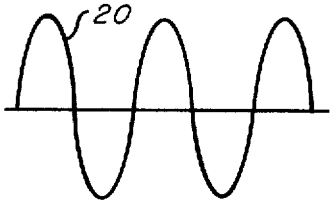
Figure 4A:
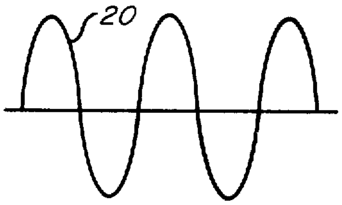
Figure 2B:
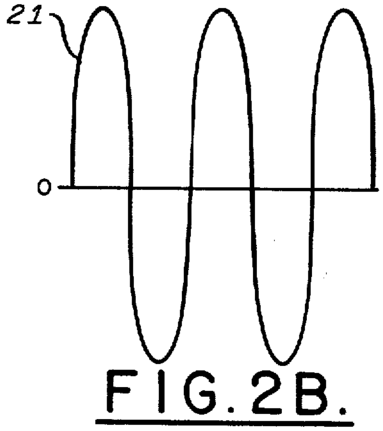
Figure 3B:
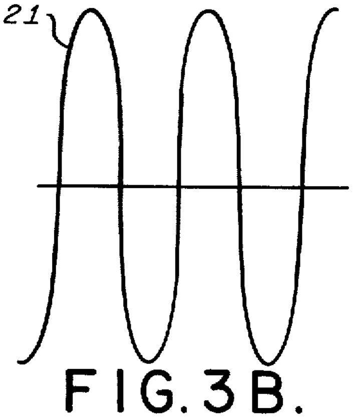
Figure 4B:
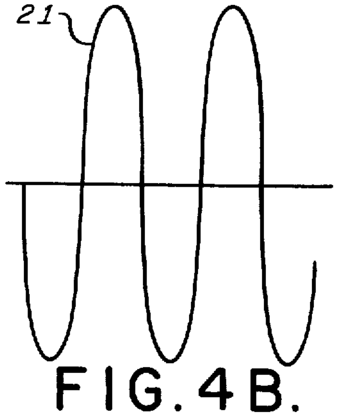
Figure 2C:
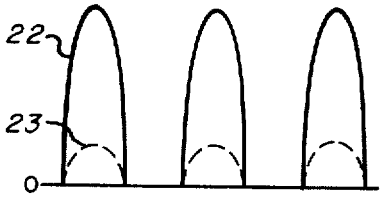
Figure 3C:
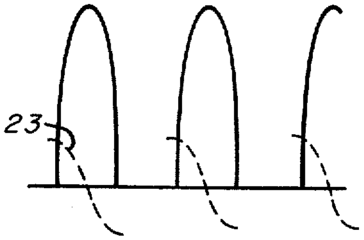
Figure 4C:
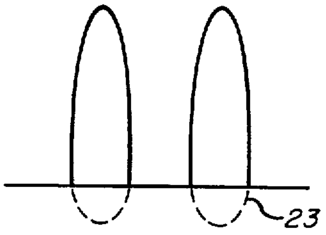
Figure 2D:
Figure 3D:
Figure 4D:

Now, the local oscillator and signal frequencies are not exactly equal, so that at a succeeding interval of time, their relative phasing may be such as that suggested in FIGS. 3A and 3B. Then, as in FIGS. 3C and 3D, the signal energy makes no net contribution to the diode rectified current. FIGS. 4A, 4B, 4C, 4D illustrate a still later situation in which the waves 20 and 21 have a relative phase such that the signal contribution 23 is negative. The net result is that a difference frequency appears on the diode bias current.

If as in the conventional mixer, the bias signal is applied by a substantially zero impedance line, the intermediate frequency signal is readily available on the ungrounded side of diode 12, and may be extracted by an appropriate filter such as filter 17 on the common signal-local oscillator-intermediate frequency line 18. All fundamental frequency mixer circuits may be represented by the foregoing analysis, even mixers with hybrid coupling schemes and multiple diode configurations, whether in single or balanced double mixer circuits.

In the conventional second harmonic mixer, which may also be generally represented by FIG. 1 in the absence of capacitor 9, the wave forms are as shown in FIGS. 5A through 7D. FIGS. 5A, 6A, 7A show the signal wave 20 at three successive time intervals. FIGS. 5B, 6B, 7B show the corresponding local oscillator waves. For purposes of generality, the signal waves 20 are in this instance shown as shifting in phase with respect to the successive local oscillator waves 21. Note that the local oscillator frequency is half that of the signal. The consequent operation is the same as that of the fundamental frequency mixer as discussed relative to FIGS. 2A through 4C, except that the interaction occurs only on every second cycle of the signal wave 20. Consequently, the available output current is halved for the same diode impedance level.

Figures 10, 11:
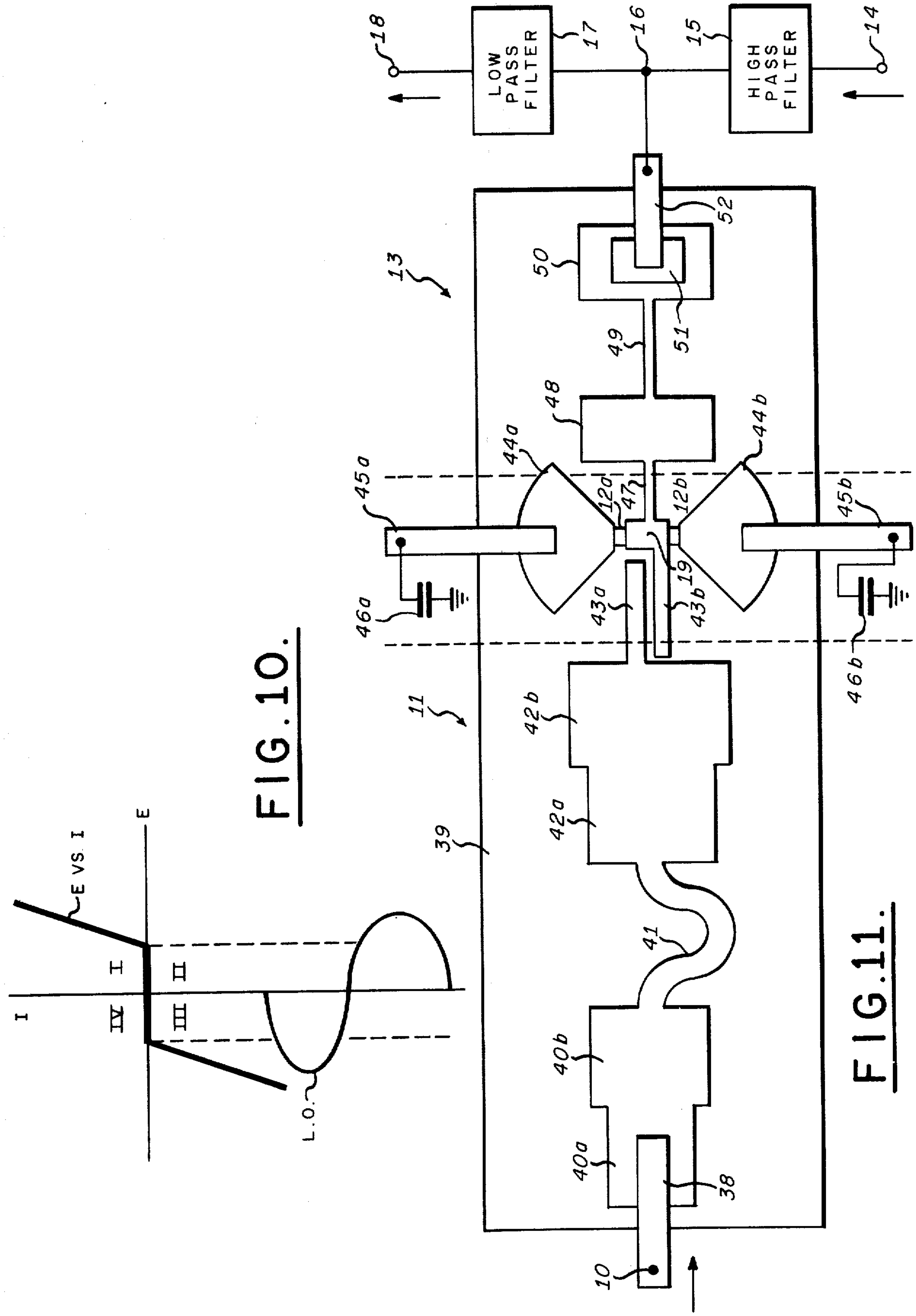
FIG. 10 is a graph useful in explaining the characteristic curve of the semiconductor elements used in the device.
FIG. 11 is a plan view of one form of the invention.

According to the present invention, capacitor 9 is employed and the single diode 12 of the conventional harmonic mixer is replaced by a dual port semiconductor device having the generally symmetric current-voltage curve of FIG. 10. One device for yielding the substantially symmetric operation of FIG. 10 may actually consist of a pair of conventional diodes coupled in inverse parallel. Easily matched microwave diodes having relatively low parasitic impedance may be employed, such as the Hewlett-Packard beam lead diode 5082-2716. Where less symmetry of the voltage-current curve may be tolerated at the risk of odd harmonic generation, a single conventional backward diode may be used, such as the Airtech Company's A1E207A backward diode. Such a diode is a variation of a conventional tunnel diode and has a p-n junction between two semiconductor regions doped just short of degeneracy so that, at zero bias, the bands do not overlap, but their edges are at the same level. It has substantially zero negative resistance.

As previously noted, the invention is put into practice by replacing the conventional mixer diode 12 in FIG. 1 with a non-rectifying element having a characteristic approaching the voltage-current characteristic of FIG. 10. However, since no rectification takes place, no closed direct current path is provided; further, the presence of rectification would actually be objectionable, as will be seen. If driven by sufficient local oscillator power, and if the flow of direct current is blocked by capacitor 9, the back-to-back or oppositely poled paired diode arrangement or the backward diode will bias themselves to operate substantially symmetrically about a voltage point that is zero or in the case of the back diode differs only slightly from zero.

For signal and local oscillator inputs respectively like those of FIGS. 5A, 6A, 7A and 5B, 6B, and 7B, the contributions with gradually changing phase relations are shown in FIGS. 8A through 9C. For the in-phase situation of FIG. 8A, the net positive current of FIG. 8B is produced. For the 90° phase relation, the net zero current of FIG. 9B results, and for the 180° case, the net negative output of FIG. 9C is achieved. Consequently, the desired intermediate frequency current is generated. Since the substituted semiconductor device, when conducting at any given time instant, has the same impedance as the single diode of the conventional fundamental mixer, twice the output current is available.

Compared to the prior configuration in which the presence of rectification is relied upon, it is observed that wave form energy interaction occurs once per cycle of the signal wave form, not merely once every second cycle. The diode not conducting at any given instant of time is substantially back biased, so that the available output current when using the invention is double that of the prior art arrangement with no change in output impedance level. This characteristic provides a desirable 6dB. conversion improvement over the prior art arrangement.

In the case in which the invention yields a generally symmetric voltage-current curve, substantially no fundamental frequency or odd-order frequency mixing components are generated. The absence, in any case, of a direct current path results in the forcing of the symmetry characteristic, since no direct current can flow and the more sensitive diode where beam lead diodes are used is nearly enough back-biased to compensate for its greater sensitivity. A particularly surprising freedom of the device from spurious mixing products is demonstrated. The fundamental and all harmonic products tend to be substantially suppressed by the symmetry. Thus, by constructing a non-rectifying mixer with two diodes in inverse parallel, or by using instead a single two-terminal semiconductor device with a degree of first and third quadrant symmetry and a central non-conducting region, an efficient second harmonic mixer is readily achieved having the advantageous characteristics of a conventional fundamental second harmonic balanced mixer.

While the invention may in practice take on a variety of forms as represented by FIG. 1, FIG. 11 illustrates one of its broad band forms operating with a 2 to 4 gHz intermediate frequency, by way of example. Low intermediate frequency or narrow band designs would vary in design from that of FIG. 11 in ways apparent to those skilled in the art and FIG. 11 is therefore offered simply as being illustrative of one form of the invention. In practice, the part of the invention thus illustrated resides as a planar circuit on a 0.014 inch thick quartz substrate 39, one inch in length and coated on its opposite side with a conductive ground plane (not seen). It will thus be apparent that the invention lends itself to use, for example, in extremely compact form.

The signal input at terminal 10 in FIG. 11 is supplied through a thin gold ribbon 38 affixed to a conductive sheet capacitive device composed of band broadening sections 40*a*, 40*b* which act as the input element of the planar high pass filter circuit 11. The remainder of the conventional planar filter 11 consists of the similar broad band broadening capacitive sections 42*a*, 42*b* coupled to elements 40*a*, 40*b* by the inductive element 41. The high pass filter 11 is coupled through junction 19 to a generally conventional low pass planar filter 13. In the example, filter 13 includes the high impedance line section 47 coupled to capacitive plate 48 which, in turn, is coupled by high impedance line section 49 to the conductive plate 50 affixed to substrate 39. Upon plate 50 is mounted a miniature or chip capacitor 51, to the top terminal of which is affixed conductor 52 leading to terminal 16. The low pass filter 17 and the high pass filter 15 may also be mounted on substrate 39 in planar or other circuit form or may be separate elements as also shown in FIG. 1 so that the local oscillator-intermediate frequency separation is accomplished by an external filter system.

In the active part of the planar circuit at terminal 19, that terminal is capacity coupled to the high pass filter 11 by side-by-side coupling strips 43*a*, 43*b*. Branching from junction 19 is a parallel planar circuit with semiconductor diodes 12*a* and 12*b* mounted so that the effective impedance at junction 19 is a symmetric non-rectifying function. A conventional broad band high frequency by-pass device 44*a* is coupled to device 12*a* for coupling signal input energy to ground. The operation is further aided by by-passing any remaining intermediate or local oscillator frequency energy through the conductive strip 45*a* and capacitor 46*a* to ground. A similar geometrically opposed planar circuit included beam lead diodes, for example, at 12*b* and also analogous by-pass elements 44*b*, 45*b*, and 46*b* for providing balanced operation.

While the invention has been described in its preferred embodiments, it is to be understood that the words that have been used are words of description rather than of limitation and that changes within the purview of the appended claims may be made without departing from the true scope and spirit of the invention in its broader aspects.

I claim:

1. Harmonic signal mixer means comprising:

high pass signal input filter means, low pass filter means in series relation with said high pass signal input filter means, high pass local oscillator signal input filter means in series relation with said low pass filter means, low pass intermediate frequency signal output means coupled between said low pass filter means and said high pass local oscillator signal input filter means, and non-rectifying signal mixer circuit means coupled between said high pass signal input filter means and said low pass filter means.

2. Apparatus as described in claim 1 wherein said non-rectifying signal mixer circuit means includes dual port semiconductor means having the general voltage versus current characteristic of FIG. 10.

3. Apparatus as described in claim 1 wherein said non-rectifying signal mixer circuit means includes dual port semiconductor means having generally a voltage versus current characteristic including:

a first finite region in which positive current values are generally proportional to positive voltage values, a second finite region in which negative current values are generally proportional to negative voltage values, and a third finite region joining said first and second finite regions, including the zero current-zero voltage locus, wherein the current is substantially zero for finite value of the voltage.

4. Apparatus as described in claim 3 wherein said dual port semiconductor means comprises a backward diode.

5. Apparatus as described in claim 3 wherein said dual port semiconductor means comprises semiconductor diodes coupled in back-to-back relation.

6. Apparatus as described in claim 3 including means for preventing direct current flow through said dual port semiconductor means.

* * * * *